United States Patent
Wu et al.

(10) Patent No.: US 8,406,058 B2
(45) Date of Patent: Mar. 26, 2013

(54) READ ONLY MEMORY AND OPERATING METHOD THEREOF

(75) Inventors: Ching-Wei Wu, Caotun Town, Nantou County (TW); Cheng-Hung Lee, Hsinchu (TW); He-Zhou Wan, Shanghai (CN); Wei-Yang Jiang, Zhejiang (CN)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 25 days.

(21) Appl. No.: 12/983,985

(22) Filed: Jan. 4, 2011

(65) Prior Publication Data
US 2011/0242904 A1 Oct. 6, 2011

(30) Foreign Application Priority Data
Apr. 2, 2010 (CN) .......................... 2010 1 0140005

(51) Int. Cl.
*G11C 11/34* (2006.01)
(52) U.S. Cl. ................ 365/185.23; 365/189.11; 365/226
(58) Field of Classification Search .............. 365/185.23, 365/185.11, 226, 185.27, 185.18, 189.09, 365/203, 230.06, 185.2
See application file for complete search history.

(56) References Cited

U.S. PATENT DOCUMENTS

| | | | | |
|---|---|---|---|---|
| 6,344,992 B1* | 2/2002 | Nakamura | .................... | 365/154 |
| 6,967,860 B2* | 11/2005 | Choi et al. | .................... | 365/145 |
| 7,034,575 B2* | 4/2006 | Gallo et al. | .................... | 326/87 |
| 2001/0020840 A1* | 9/2001 | Kojima | .................... | 323/282 |
| 2002/0163841 A1* | 11/2002 | Taura et al. | .............. | 365/189.11 |
| 2005/0258887 A1* | 11/2005 | Ito et al. | .................... | 327/333 |
| 2011/0194362 A1* | 8/2011 | Lu et al. | .................... | 365/189.11 |
| 2011/0235442 A1* | 9/2011 | Campbell et al. | ........ | 365/189.11 |

* cited by examiner

*Primary Examiner* — Dang Nguyen
(74) *Attorney, Agent, or Firm* — McClure, Qualey & Rodack, LLP

(57) ABSTRACT

A read only memory (ROM) and an operating method thereof are provided. The read only memory includes: a control circuit, powered by a first power source for outputting a control signal within a first voltage range; a voltage shifter, for expanding the amplitude of the control signal to a second voltage range; a word line driver, powered by a second power source with a voltage which is higher than that of the first power source, for driving one of a plurality of word lines of a read only memory cell array according to the control signal which is expanded to be within the second voltage range; and an input/output circuit, for connecting the plurality of bit lines to read out messages.

14 Claims, 6 Drawing Sheets

READ ONLY MEMORY AND OPERATING METHOD THEREOF

CROSS REFERENCE TO RELATED APPLICATION

This Application claims priority of China Patent Application No. 201010140005.6, filed on Apr. 2, 2010, the entirety of which is incorporated by reference herein.

BACKGROUND OF THE INVENTION

1. Field of the Invention

The present invention relates to a read only memory, and in particular relates to a read only memory and operating method thereof.

2. Description of the Related Art

In chip design it is common to use low operating voltages to reduce energy consumption. However, for read only memories, operation in low voltages is difficult because of manufacturing weak bit cell. Operating speeds of read only memories are seriously affected when operating with low voltages. Thus, a new read only memory structure which can operate using low operating voltages with low power and high speeds is call for.

FIG. 1 is a 2×2 read only memory cell array. The 2×2 read only memory cell array includes a plurality of read only memory cells BC00, BC01, BC10 and BC11. The plurality of read only memory cells are respectively made up of a plurality of word lines WL[0] and WL[1], and a plurality of bit lines BL[0] and BL[1]. Each of the read only memory cells BC00, BC01, BC10 and BC11 includes an n-type transistor having a gate connected to a corresponding word line, a drain connected to a corresponding bit line and a source, and stores data according to the status of the source. For example, the gate of the n-type transistor in the read only memory cell BC00 is connected to a word line WL[0], the drain is connected to a bit line BL[0] and the source is floating so that a first data such as '0' can be stored therein. The n-type transistor in the ROM cell BC01 is connected to the word line WL[0], the drain is connected to a bit line BL[1], and the source is connected to a low voltage level Vss so that a second data such as '1' can be stored therein. The n-type transistor in the ROM cell BC10 is connected to a word line WL[1], the drain is connected to the bit line BL[0], and the source is floating so that the first data such as '0' can be stored therein. The n-type transistor in the ROM cell BC11 is connected to the word line WL[1], the drain is connected to the bit line BL[1], and the source is connected to low voltage level Vss so that the second data such as '1' can be stored therein. The reading procedure is described hereafter. For example, when the ROM cell BC00 is read, the word line WL[0] is selected so that the voltage potential at the source of the n-type transistor in the ROM cell BC00 is delivered to the bit line BL[0]. However, the n-type transistor of the ROM cell BC00 is floating so that the voltage potential at the bit line BL[0] is not affected. Hence, the content of the ROM cell BC00 is '0'. Also, when the ROM cell BC11 is read, the word line WL[0] is selected so that the voltage potential at the bit line BL[1] can be discharged by the n-type transistor of the ROM cell BC11. Hence, the data '1' stored in the ROM cell BC11 can be determined by reading the bit line BL[1] according to the discharge statement.

Nevertheless, the discharge at the bit lines may be affected by low operating voltages. The FIG. 2 shows an example with a waveform graph, which describes signal status of the ROM cell BC11 of FIG. 1 when it operates at a low operating voltage. The signal Clk is a clock. There is a pre-charge time interval 202 at the time sequence of the bit line BL[1] signal. After the word line WL[1] is selected, the time sequence of the bit line BL[1] signal enters into a discharge time interval 204. However, a low operating voltage leads to a tiny discharge current at bit line BL[1] such that the bit line BL[1] signal can not discharge completely. Eventually, it is difficult for other circuits to correctly determine the stored data in the ROM cell BC11.

BRIEF SUMMARY OF INVENTION

A detailed description is given in the following embodiments with reference to the accompanying drawings.

In one embodiment, the invention provides a read only memory. The read only memory includes a control circuit, powered by a first power source, for outputting a control signal within a first voltage range; a voltage shifter, for expanding the amplitude of the control signal to a second voltage range, wherein the top voltage level of the second voltage range is higher than that of the top voltage level of the first voltage range; a word line driver, powered by a second power source with a voltage which is higher than that of the first power source, for driving one of a plurality of word lines of a read only memory cell array according to the control signal which is expanded to be within the second voltage range; the read only memory cell array having a plurality of read only memory cells, wherein the plurality of read only memory cells are made up of a plurality of word lines and bit lines, and each read only memory cell has an n-type transistor having a gate coupled to a respective corresponding word line and a drain coupled to a respective corresponding bit line; and an input/output circuit, for connecting the plurality of bit lines to read out messages.

In another embodiment, the invention provides an operating method for read only memories. The operating method includes providing a first power source to a control circuit of a read only memory such that a control signal generated by the control circuit is within a first voltage range; expanding the amplitude of the control signal to a second voltage range, and inputting the control signal to a bit line driver of the read only memory, wherein the top voltage level of the second voltage range is higher than that of the top voltage level of the first voltage range; providing a second power source to the word line driver such that the word line driver drives one of a plurality of bit lines of a read only memory cell array of the read only memory according to the control signal which is expanded to be within the second voltage range, wherein the second power source is higher than that of the first power source; and connecting an input/output circuit of the read only memory to the plurality of bit lines of the read only memory cell array to read out messages, wherein the read only memory cell array having a plurality of read only memory cells, an the plurality of read only memory cells are made up of the plurality of word lines and bit lines, and each read only memory cell has a n-type transistor having a gate connected to a respective word line and a drain connected to a corresponding bit line.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
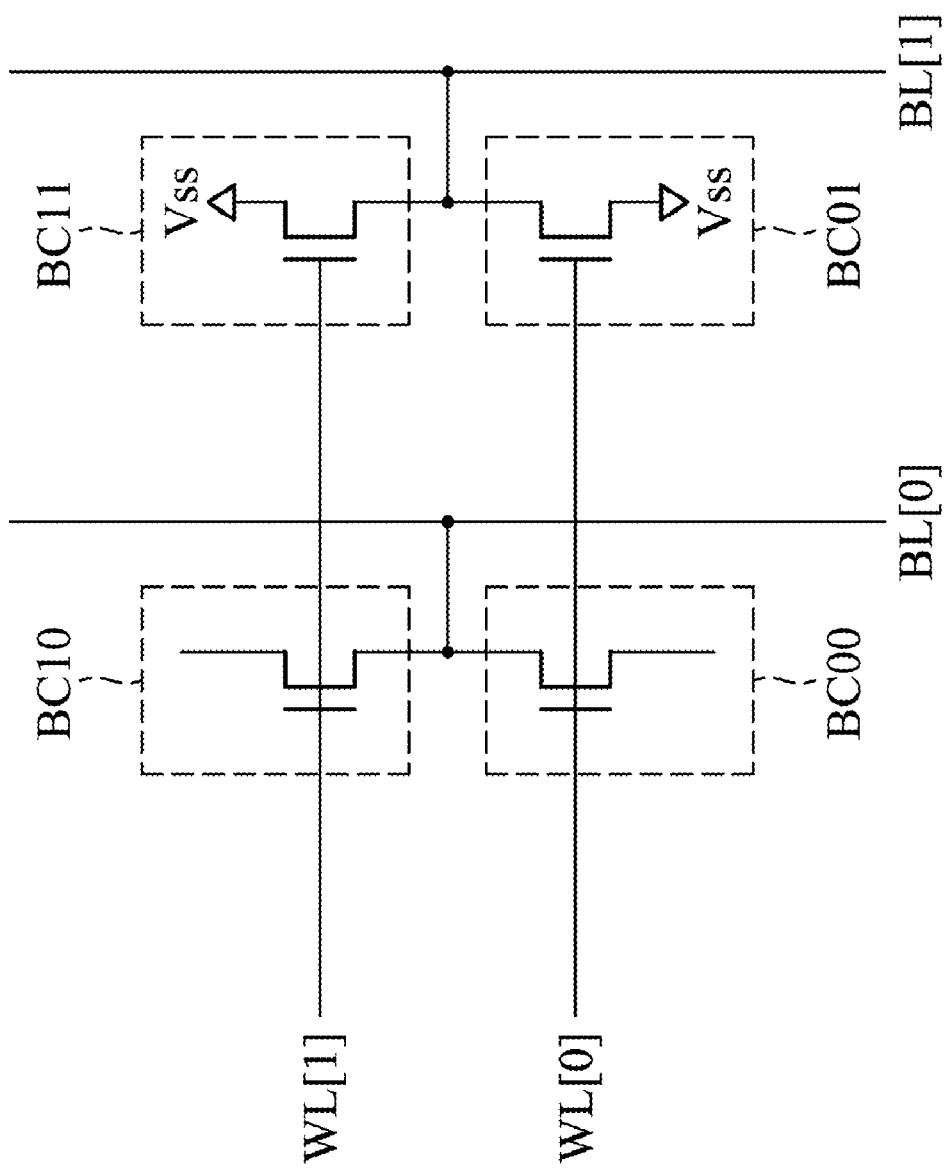
FIG. 1 is a 2×2 read only memory array.
Figure 2:
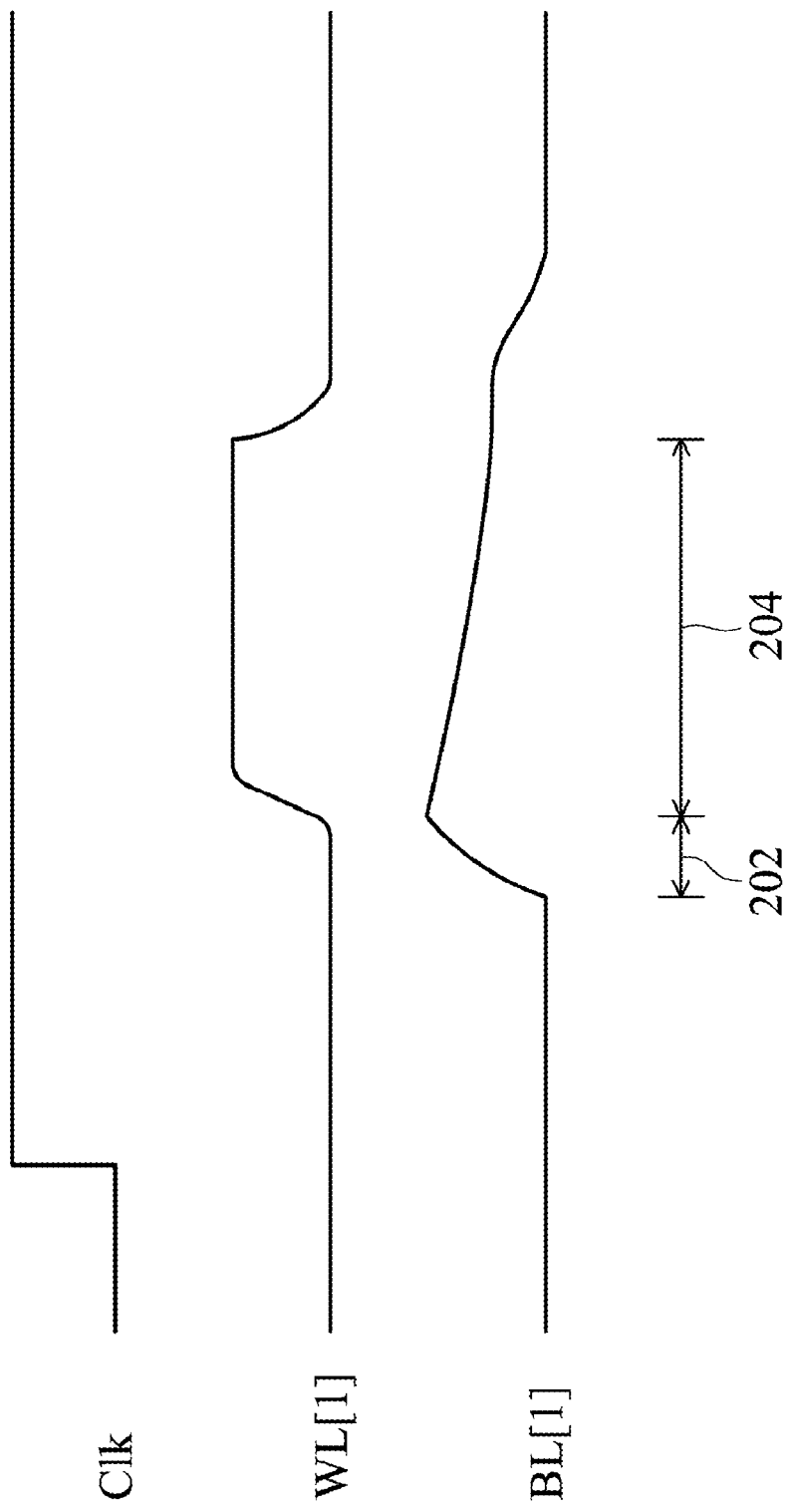
FIG. 2 is a waveform graph illustrating signal status of the read only memory cell BC11 of FIG. 1 under a low operating voltage.
Figure 3:
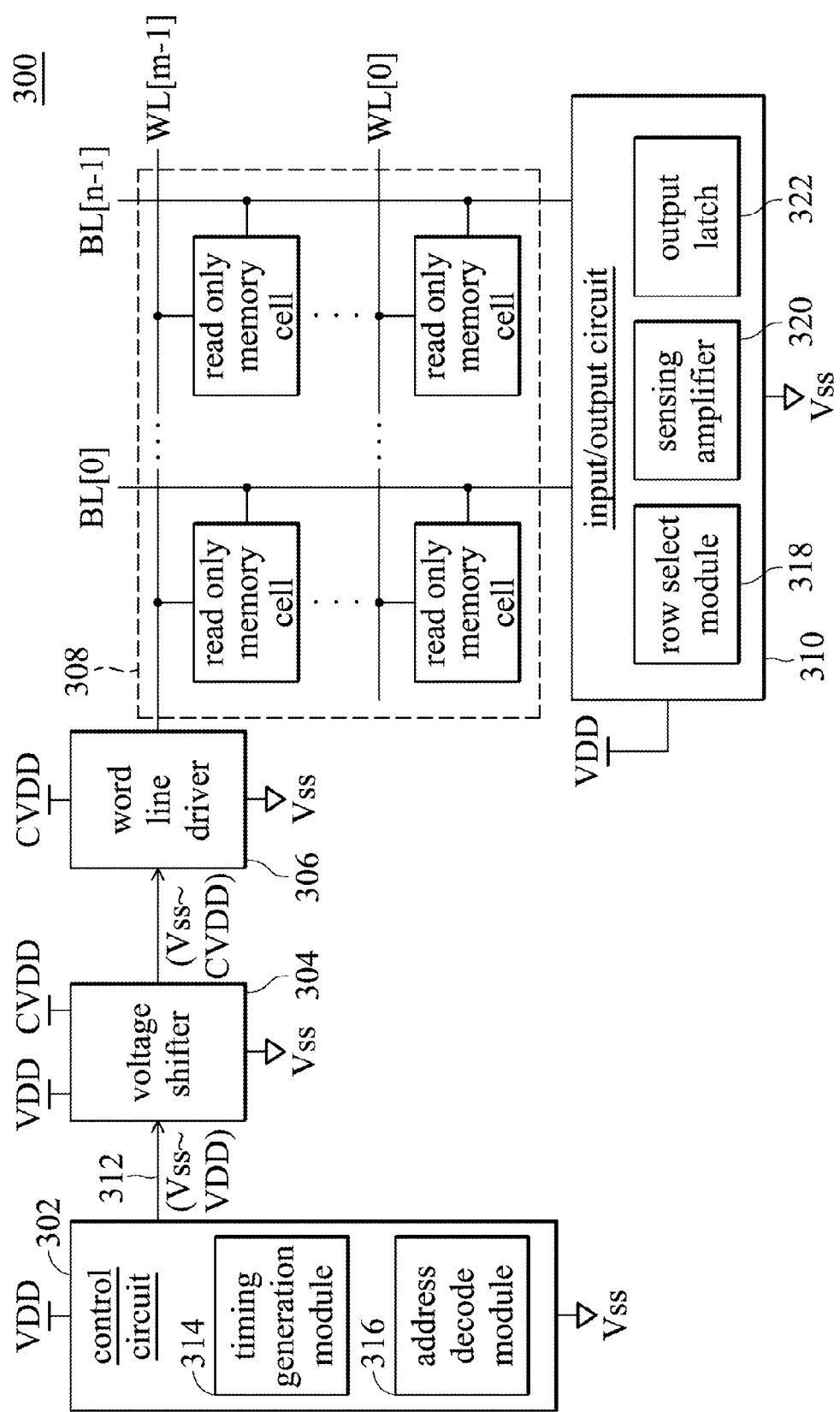
FIG. 3 is an embodiment of the read only memory array of the invention.

FIG. 3 is an embodiment of the read only memory (ROM) cell array of the invention. The ROM 300 includes a control circuit 302, a voltage shifter 304, a word line driver 306, a ROM cell array 308 and an input/output circuit 310. The ROM 300 has two power sources: the first power source VDD and the second power source CVDD. The voltage of the first power source is lower than that of the second power source. The ROM cell array 308 has a plurality of ROM cells. The plurality of ROM cell are made up of a plurality of word lines WL[0] ... WL[m−1] and a plurality of bit lines BL[0] ... BL[n−1]. As an example in FIG. 1 shows, the ROM cell has an n-type transistor with a gate connected to a corresponding word line and a drain connected to a corresponding bit line.

The other circuits of the ROM 300 are discussed hereafter. The control circuit 302 powered by a first voltage source VDD is used to output a control signal 312 within a first voltage range (such as from Vss to VDD). The amplitude of the control signal 312 is expanded to be within a second voltage range (such as from Vss to CVDD) by the voltage shifter 304 and then it is sent into the word line driver 306. It is noted that the top level (CVDD) of the second voltage range is higher than that of the top level (VDD) of the first voltage range. In this manner, activation of the word line driver 306 (powered by CVDD) is assured. The word line driver 306 may select one of the plurality of word lines (such as WL[m−1]) in the ROM cell array 308 such that a gate of a transistor connected to the selected word line is driven with a higher voltage level (CVDD). With regard to the input/output circuit 310, it is powered by the first power source VDD and used to read messages from the plurality of bit lines BL[0] ... BL[n−1]. With this structure, the first power source VDD is set as a very low voltage to reduce power consumption, and the response speed of the ROM 300 is not affected.

Moreover, the first power source VDD is further used to supply to drains of transistors in the ROM cell array 308 to charge bit line BL[0] ... BL[n−1].

The control circuit 302 includes a timing generation module 314 and an address decode module 316, which are used to provide timing control and address decode to generate the control signal 312. The input/output circuit 310 also includes a row select module 318, sensing amplifier 320 and output latch 322, which are used to select bit lines, for sensing and amplifying, and to latch output to read messages.

Figure 4:
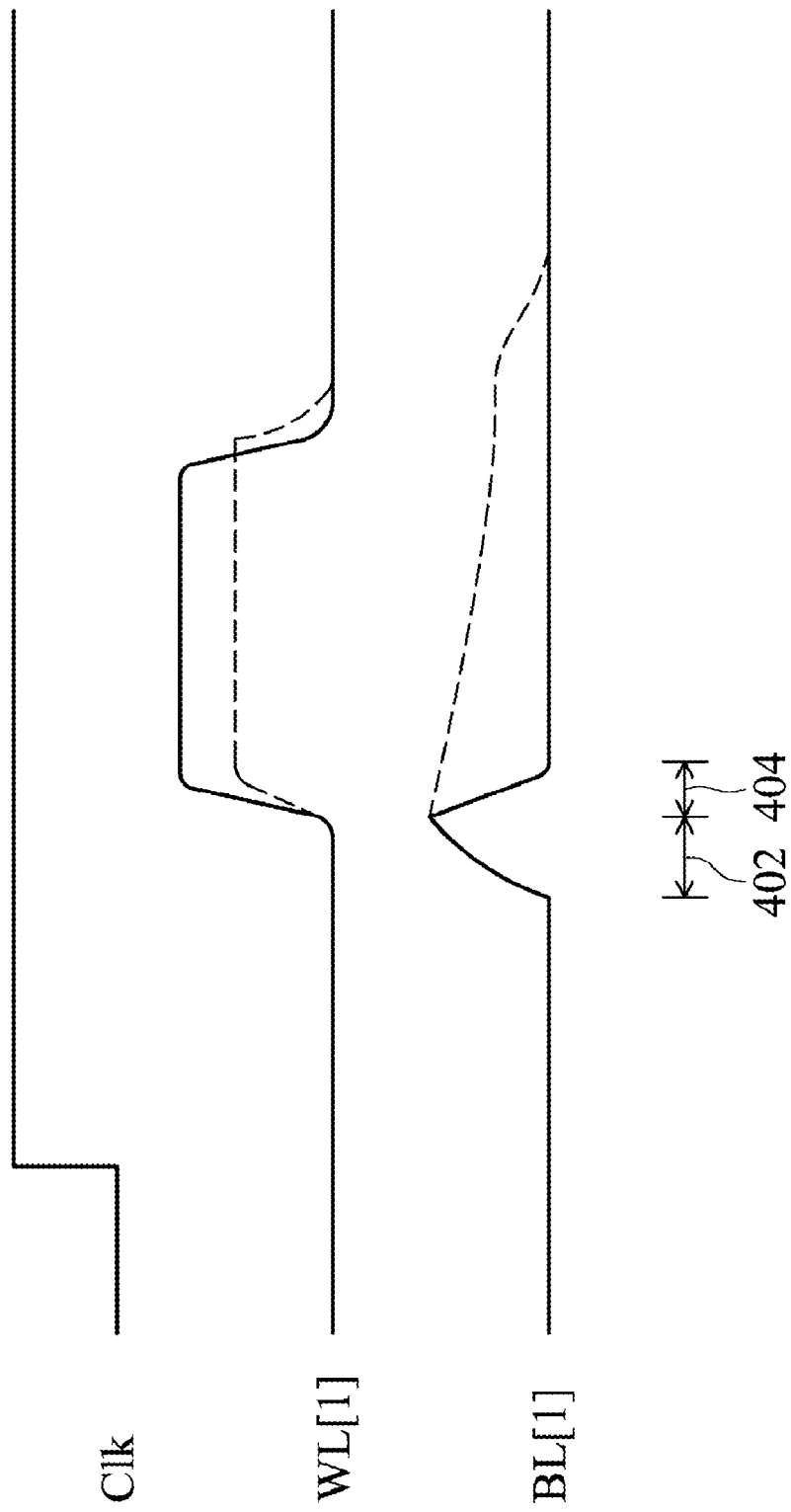
FIG. 4 is a waveform graph illustrating signal status of the read only memory cell BC11 of FIG. 1 with the structure of FIG. 3.

FIG. 4 is a waveform graph illustrating signal status of the read only memory cell array of FIG. 1 with the structure of FIG. 3. The figure shows that a bit line BL[1] signal has a pre-charge time interval 402 at its time sequence. After the word line WL[1] is selected, the time sequence of the bit line BL[1] signal enters into a discharge time interval 404 and discharges extremely quick.

Regarding the real lines and dash lines in the FIG. 4, the structure of FIG. 3 can maintain the word line WL[1] at a fixed voltage level when the word line WL[1] is selected. In this manner, referring to FIG. 1, the voltage level at the gate of the n-type transistor in the ROM cell BC11 is sufficient so that the discharge speed of the bit line BL[1] is efficient. Consequently, the structure of FIG. 3 solves reading mistakes resulting from low operating voltages in the conventional structures.

Moreover, it can be found that the first power source VDD used by the majority of circuits in the ROM 300 can be operated at a low operating voltage. Hence, the structure of FIG. 3 has low power consumption.

Figure 5:
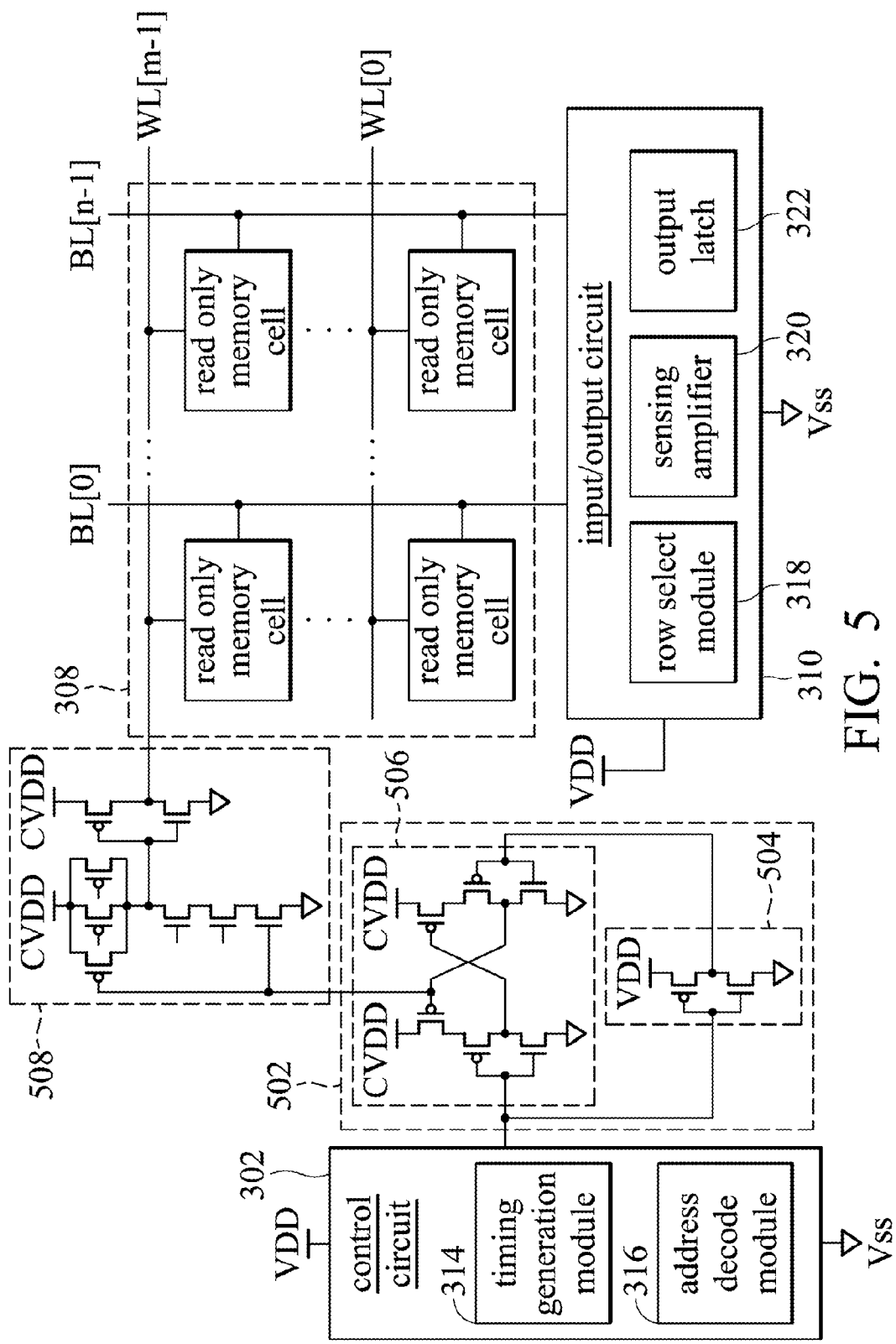
FIG. 5 is an embodiment of the structure of FIG. 3.

FIG. 5 is an embodiment of the structure of FIG. 3; and the circuit 502 is used to embody the voltage shifter 304 of FIG. 3, which includes an inverter 504 driven by the first source VDD and a latch circuit 506 driven by a second power source CVDD. The first voltage range (Vss to VDD) of a signal provided by the control circuit 302 can be expanded to be within the second voltage range (Vss to CVDD) by the circuit 502. The circuit 508 is used to embody the word line driver 306 of FIG. 3, which receives signals from the voltage shifter 502. As the figure shows, the circuit 508 is an AND gate driven by the second power source CVDD. The signal output from the circuit 502 is the input signal of the AND gate.

However, the ROM cell array of FIG. 1 and the circuits 502 and 504 of FIG. 5 are merely exemplary but are not limited thereto. Those skilled in the art may achieve the same advantages of the ROM cell array, the voltage shifter and world line driver of the invention according to conventionally equivalent circuits.

For example, the above-discussed ROM may not only be of a NOR-type structure but also may be of a NAND-type structure. For a NAND-type structure, in each ROM cell the gates of the transistors connected to the bit lines are driven by higher voltage levels (CVDD) such that the discharge speed of corresponding bit lines can be maintained without reading mistakes.

Figure 6:
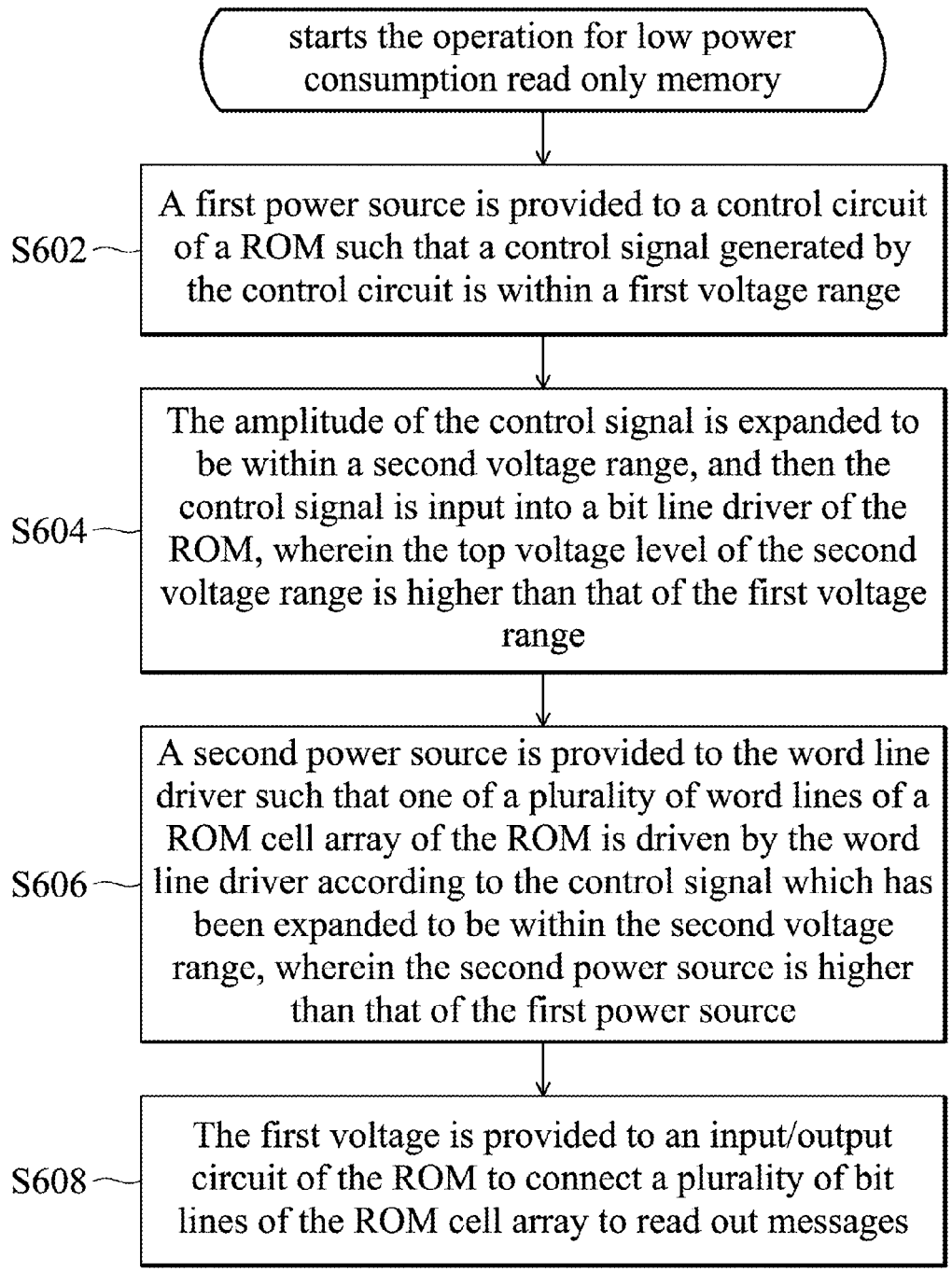
FIG. 6 is a flow chart illustrating the operating method of the read only memory of the invention.

The invention further discloses an operating method of the ROM. FIG. 6 is a flow chart illustrating the operating method of the read only memory of the invention. In step S602, a first power source is provided to a control circuit of a ROM such that a control signal generated by the control circuit is within a first voltage range. In step 604, the amplitude of the control signal is expanded to be within a second voltage range, and then the control signal is input into a bit line driver of the ROM, wherein the top voltage level of the second voltage range is higher than that of the first voltage range. In step 606, a second power source is provided to the word line driver such that one of a plurality of word lines of a ROM cell array of the ROM is driven by the word line driver according to the control signal which has been expanded to be within the second voltage range, wherein the second power source is higher than that of the first power source. In step S608, the first voltage is provided to an input/output circuit of the ROM to connect a plurality of bit lines of the ROM cell array to read out messages. The ROM cell array is formed by the forgoing structure (as FIG. 1 shows, or a NAND-type structure). The control circuit may provide timing control and address decode module to generate the control signal. The input/output circuit may carry out bit line selection, sensing and amplifying, and output latch to read out messages.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A read only memory, comprising:
    a control circuit, powered by a first power source, for outputting a control signal within a first voltage range;
    a voltage shifter, for expanding the amplitude of the control signal to a second voltage range, wherein the top voltage level of the second voltage range is higher than that of the top voltage level of the first voltage range;
    a word line driver, powered by a second power source with a voltage which is higher than that of the first power source, for driving one of a plurality of word lines of a read only memory cell array according to the control signal which is expanded to be within the second voltage range;
    the read only memory cell array having a plurality of read only memory cells, wherein the plurality of read only memory cells are made up of a plurality of word lines and bit lines, and each read only memory cell has an n-type transistor having a gate coupled to a respective corresponding word line and a drain coupled to a respective corresponding bit line; and
    an input/output circuit, for connecting the plurality of bit lines to read out messages, wherein the input/output circuit comprises a row select module, a sensing amplifier and an output latch for implementing bit line selection, sensing and amplifying, and output latch to read messages, and the input/output circuit is powered by the first power source.

2. The read only memory as claimed in claim 1, wherein the gate of the n-type transistor is driven by a voltage which is higher than that of a first power source.

3. The read only memory as claimed in claim 1, wherein the control circuit provides timing control and address decode to generate the control signal.

4. The read only memory as claimed in claim 3, wherein the control circuit comprises a timing generation module and an address decode module.

5. The read only memory as claimed in claim 1, wherein the read only memory cell is of a NOR-type structure or a NAND-type structure.

6. The read only memory as claimed in claim 1, wherein the voltage shifter comprises an inverter circuit and a latch circuit.

7. The read only memory as claimed in claim 6, wherein the inverter circuit is powered by the first power source.

8. The read only memory as claimed in claim 7, wherein the latch circuit is powered by the second power source.

9. The read only memory as claimed in claim 1, wherein the word line driver comprises a AND gate.

10. The read only memory as claimed in claim 9, wherein the AND gate is made up of a NAND gate and a NOT gate.

11. An operating method for read only memories, comprising:
    providing a first power source to a control circuit of a read only memory such that a control signal generated by the control circuit is within a first voltage range;
    expanding the amplitude of the control signal to a second voltage range, and inputting the control signal to a bit line driver of the read only memory, wherein the top voltage level of the second voltage range is higher than that of the top voltage level of the first voltage range;
    providing a second power source to the word line driver such that the word line driver drives one of a plurality of bit lines of a read only memory cell array of the read only memory according to the control signal which is expanded to be within the second voltage range, wherein the second power source is higher than that of the first power source;
    connecting an input/output circuit of the read only memory to the plurality of bit lines of the read only memory cell array to read out messages, wherein the input/output circuit comprises a row select module, a sensing amplifier and an output latch for implementing bit line selection, sensing and amplifying, and output latch to read messages, and the input/output circuit is powered by the first power source; and
    wherein the read only memory cell array has a plurality of read only memory cells, wherein the plurality of read only memory cells are made up of the plurality of word lines and bit lines, and each read only memory cell has a n-type transistor having a gate connected to a respective word line and a drain connected to a corresponding bit line.

12. The method as claimed in claim 11, wherein a voltage higher than that of the first power source drives the gate of the n-type transistor.

13. The method as claimed in claim 11, wherein the control circuit provides timing control and address decode to generate the control signal.

14. The method as claimed in claim 11, wherein the read only memory cell is implemented with a NOR-type structure or a NAND-type structure.

* * * * *